United States Patent [19]
Ludwig et al.

[11] Patent Number: 5,581,498
[45] Date of Patent: Dec. 3, 1996

[54] STACK OF IC CHIPS IN LIEU OF SINGLE IC CHIP

[75] Inventors: David E. Ludwig, Irvine; Christ H. Saunders, Laguna Niguel, both of Calif.; Raphael R. Some, Williston, Vt.; John J. Stuart, Newport Beach, Calif.

[73] Assignee: Irvine Sensors Corporation, Costa Mesa, Calif.

[21] Appl. No.: 326,645

[22] Filed: Oct. 20, 1994

Related U.S. Application Data

[63] Continuation-in-part of Ser. No. 106,909, Aug. 13, 1993, abandoned.

[51] Int. Cl.⁶ .............................. G11C 5/06; H01L 23/02
[52] U.S. Cl. .................. 365/63; 365/51; 257/686; 257/777; 361/735
[58] Field of Search .................. 365/51, 52, 63; 257/686, 777; 361/684, 735

[56] References Cited

U.S. PATENT DOCUMENTS

| | | | |
|---|---|---|---|
| 5,198,888 | 3/1993 | Sugano | 257/686 |
| 5,343,075 | 8/1994 | Nishino | 257/686 |
| 5,345,412 | 9/1994 | Shiratsuchi | 365/63 |
| 5,347,428 | 9/1994 | Carson | 257/686 |

*Primary Examiner*—David C. Nelms
*Assistant Examiner*—Son Mai
*Attorney, Agent, or Firm*—Thomas J. Plante

[57] ABSTRACT

An electronic package is disclosed in which a plurality of stacked "same function" IC chips are designed to be used in lieu of a single IC chip, and to fit into a host computer system, in such a way that the system is "unaware" that substitution has been made. Memory packages are of primary interest, but other packages are also feasible, such as packages of FPGA chips. In order to "translate" signals between the host system and the stacked IC chips, it is necessary to include suitable interface circuitry between the host system and the stacked chips. Specific examples are disclosed of a 4 MEG SRAM package containing 4 stacked IC chips each supplying a 1 MEG memory, and of 64 MEG DRAM packages containing 4 stacked IC chips each supplying a 16 MEG memory. The interface circuitry can be provided by a single special purpose IC chip included in the stack, referred to as a VIC chip, which chip provides both buffering and decoding circuitry. Additionally, the VIC chip should provide power supply buffering. And, if it has sufficient real estate, such performance enhancing functions as error correction, memory cache, and synchronized memory may be included in the VIC chip circuitry.

23 Claims, 10 Drawing Sheets

STACK OF IC CHIPS IN LIEU OF SINGLE IC CHIP

This application is a continuation-in-part of application Ser. No. 08/106,909, filed Aug. 13, 1993, abandoned.

BACKGROUND OF THE INVENTION

This invention relates to the use of a stack of IC chips in lieu of a single IC chip in an electronic host system. A major opportunity for this technology is in the field of memory chips, but it can be adapted to other IC chips, such as those used in DSP (digital signal processing) systems and in communication systems. A field of interest is logic devices, such as field programmable gate arrays (FPGA).

Referring to the memory field, the progression of memory chip technology from one generation to the next, e.g., from 4 Megabit (MEG) Dynamic Random Access Memory (DRAM) to 16 Megabit (MEG) DRAM, drives the design of successive generations of computer systems and processors. These generational jumps in memory technology grow progressively more and more expensive (now on the order of $1 billion per generation) for manufacturers of memory chips, because of the relatively fixed planar geometry of single memory chips and the resultant need for more and more geometrically precise semiconductor processing techniques to add features within this confined space.

The present invention is useful with all types of memory chips, including DRAM, SRAM (Static Random Access Memory), EEPROM (Electrically Erased Programmable Read Only Memory), and FLASH, a fast EEPROM. A high priority is the progression of DRAM memories, which are currently being redesigned to go from monolithic 16 MEG units to 64 MEG units. In the current redesign of SRAM memory units, the effort is to go from 1 MEG to 4 MEG units.

The field of logic devices, e.g., FPGAs, is presently limited by the need for greater density of available gates and transistors, in order to perform more complex tasks.

SUMMARY OF THE INVENTION

Generally stated, the present invention is intended to increase density of electronic components available for electronic host systems, by providing a stack of chips which: (a) fits into the same space as that required by a single chip; and (b) mimics a single chip in such a way that the host system "sees" the stack as if it were a single chip. This concept can be used in retrofitting or upgrading an existing host system; or it can be included in a host system design, as a component available for use in such a system.

This goal of substitution of a stack of chips is accomplished essentially by two improvements:

(1) An IC chip is added to the stack which contains all the IC circuitry required to interface the stack with the host system, without requiring any alterations in the circuitry in the rest of the host system.

(2) The combined stack and interface chip are structurally integrated in such a way that the combination fits into the available real estate.

Where the stacked chips are memory chips, the stack will multiply the amount of the otherwise available memory. If a single chip were available to match the total memory of the stacked chips, it would not fit into the available space on the PC board. If such a high-memory single chip is available, a plurality of such chips can be used to radically increase the memory in the host system. The multiple IC memory chips in a stack and the additional interface chip share the same footprint, thereby avoiding the need for additional space. There are "headroom" limitations, but packages which have been standardized afford adequate volume for the new stacked chip component (module). The acronym "VIC" has been applied to the added interface chip, and the stack incorporating such a chip has been referred to as a "VIC stack".

In order to provide more available memory using less demanding chip-level processing technology, multiple memory chips of an earlier design can be thinned and stacked into a package unit, using the short stack technology developed by the assignee of this application, Irvine Sensors Corporation. Such a stacked unit can be made in a form which appears to the host system to be identical to a single chip. For example, four 16 MEG DRAMs can be stacked into a unit which appears functionally, electrically and dimensionally to be a 64 MEG single chip DRAM when installed. This change can be thought of either as "replacing" an actual or potential higher density single chip, or as "upgrading" the memory of the existing host system.

The present invention provides, in a short stack of IC chips the additional functions (i.e., "additional" to the functions of previous short stacks) which are needed to mimic the performance of a single IC chip. Specifically the new short stack incorporates novel decoding and buffering circuitry. This novel circuitry may be conveniently provided by a separate chip included in the short stack.

The short stack which is substituted for a single IC chip also can, if desired, provide functional improvements over the single chip, which are not feasible in the latter because of the complexity of circuitry design in a single chip.

Several packaging options are available, based on industry standards. Examples are the SOJ (small outline J), LCC (leadless chip carrier), PGA (pin grid array), DIP (dual in-line package), etc. Generally, any new design can be fitted to any package. The industry standard referred to as JEDEC determines which size packages are appropriate for a given memory capability, e.g., 4 MEG, 16 MEG, 64 MEG. The number of leads used in a given package (established by the standard) has to be sufficient to provide the necessary address lines, data lines, and control lines.

In addition to memory devices, the present invention may be applied to other configurations. One alternate field is a VIC stack of programmable logic devices. These devices, in order of complexity and number of gates (least to most) include: Programmable Logic Devices (PLDs), Complex Programmable Logic Devices (CPLDs) and Field Programmable Gate Arrays (FPGAs). Each programmable logic device is an array of unconnected gates and transistors. These devices can be interconnected once or many times depending on the device. The interconnection of the gates and transistors forms the arrays into circuits which then perform tailored functions. The complexity of the task which a programmable logic device can perform is dependent on the number of gates and transistors which are on the IC. Thus a stack of 4 FPGAs, for example, would have the potential of being used to performing a digital task having four times the complexity that a single FPGA could perform.

BRIEF DESCRIPTION OF THE DRAWINGS

FIG. 1a is an end view, FIG. 1b a bottom view, FIG. 1c a top view, and FIG. 1d a side view;

DETAILED DESCRIPTION OF SPECIFIC EMBODIMENTS

A stack of chips having multiple "same function" IC chips, combined with an interface IC chip, will be referred to as a VIC stack. The circuitry incorporated into the interface IC chip includes all circuitry required to fit the stack completely into the host electronic system. The structure of the VIC stack must physically fit into the available real estate. The latter requirement can be guaranteed by mounting the VIC stack in a suitable standard container, e.g., a memory container designed to JEDEC standards.

Essentially the same principles apply to the application of JEDEC standards to any type of memory chip (e.g., DRAM, SRAM, etc.) and to any capacity of memory chip (e.g., 4 MEG, 16 MEG, 64 MEG, etc.).

FIGS. 1a to 1d show exterior views of a JEDEC standard SOJ container adapted to house a 4 MEG SRAM. The same general concepts apply to other types and capacities of memory chips, except for variations in the size of the container (package) and the number of leads attached to the package.

Figure 1A:
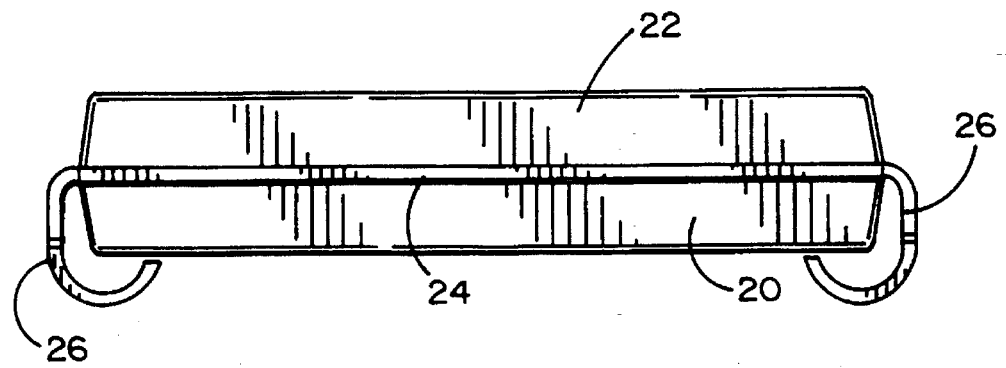
FIGS. 1a–1d are exterior views of a JEDEC standard 32 lead SOJ package which is adapted to contain a 4 MEG SRAM chip.
Figure 1B:
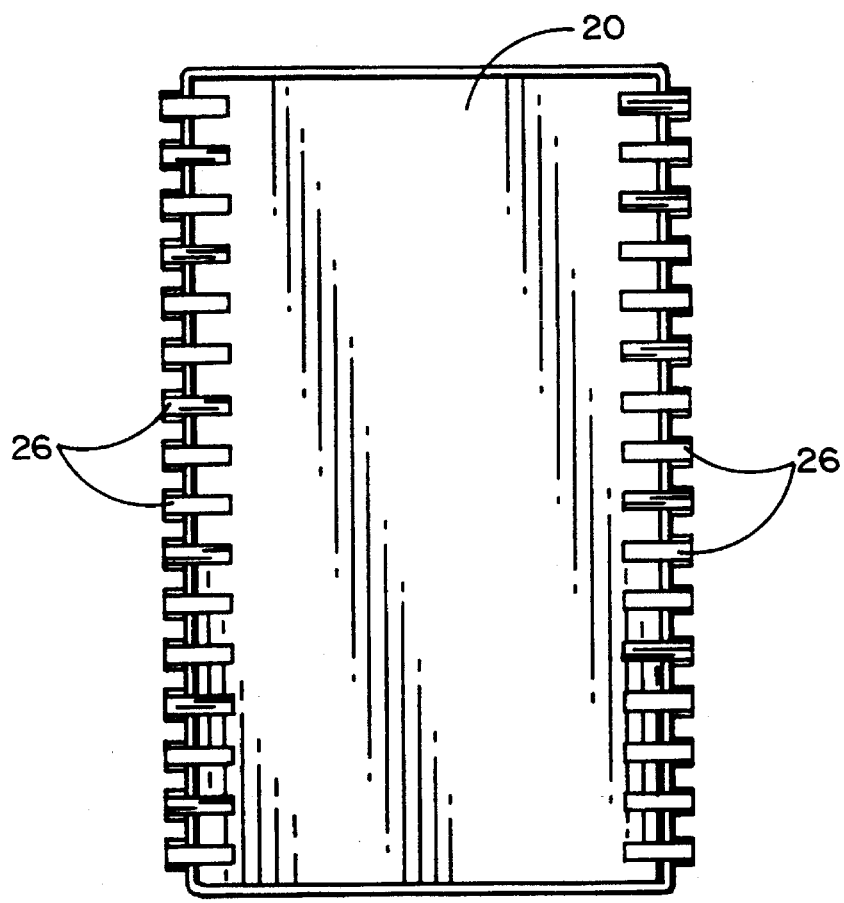
Figure 1C:
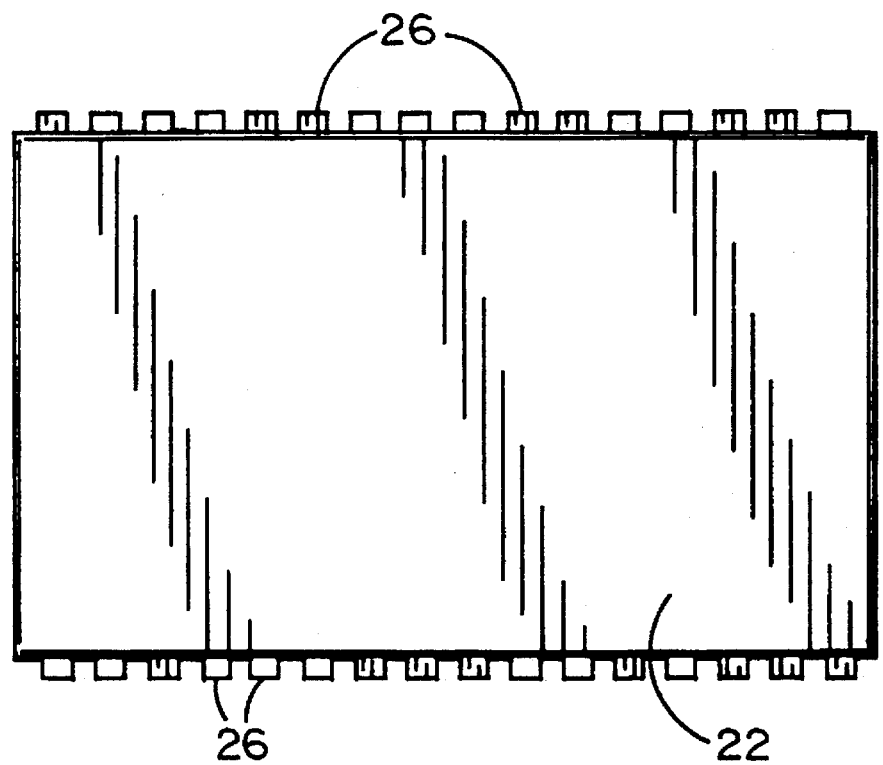
Figure 1D:
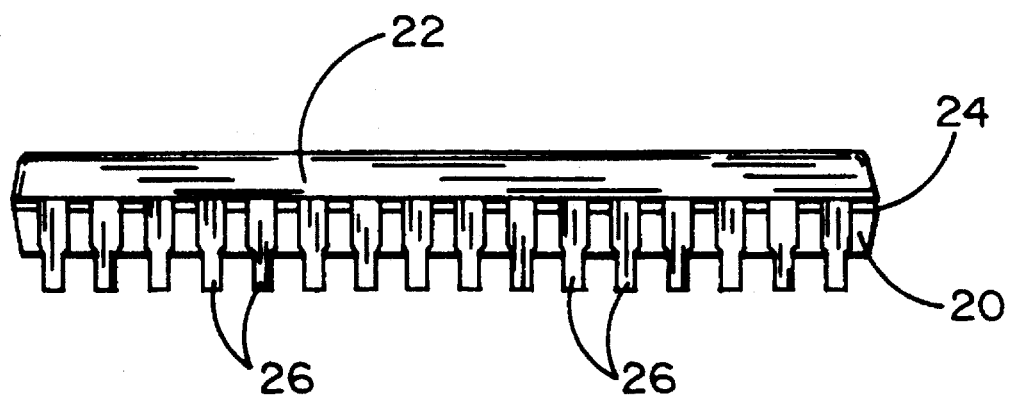

FIG. 1a is drawn to a larger scale than the other three figures. The package exterior comprises a lower body portion 20, an upper body portion 22, and a seal 24 between the lower and upper body portions. Extending from the enclosed IC memory chip (not shown) are a plurality of J-shaped (in profile) leads 26, which connect the enclosed chip (or chips) to exterior electrical connections in the host system. From the bottom view, FIG. 1b, it is apparent that 32 J-shaped leads are provided, 16 along each side of the package. Corresponding numerals are applied in FIGS. 1c and 1d.

The dimensions of the package shown in FIGS. 1a-1d are approximately 0.75 inch long×0.4 inch wide×0.1 inch high. A single 4 MEG SRAM chip would largely fill the length and width space inside the package. However, its thickness would generally be 20 mils or less, leaving a substantial amount of unused vertical space ("Z" dimension).

The present invention, in effect, provides the equivalent of a single 4 MEG chip by using a stack of chips. Assuming each chip in the stack provides a 1 MEG SRAM, four such chips will equal the memory capacity of a single 4 MEG chip. The thickness of each 1 MEG chip can be 4 mils or less.

It is not feasible to merely replace the 4 MEG single chip with a stack of four 1 MEG chips. In order to have the stack "mimic" the single chip, and operate within the host system as though it were a single chip, it is necessary to provide in the stack additional circuitry. Such additional circuitry must include input-output buffering, which presents a unit load instead of a 4 times load on the host system circuitry. In almost all cases, such additional circuitry will require decoding/addressing, so that the stack looks like one large IC, instead of 4 ICs in a stack. And another important function of such additional circuitry is power supply buffering, which causes increased signal transmission speed in what is referred to as the "glue logic".

The circuitry for these functions can be included in a single IC chip which is added to the stack. Additionally, it is convenient to include in the stack a sixth layer, which is a terminal-carrying layer, such as the ceramic top layer disclosed in common assignee application Ser. No. 08/232,739. Various stacking concepts can be used, but the "pancake" stacks shown in FIGS. 2, 3 and 4 are best adaptable to headroom limitations.

Figure 2:
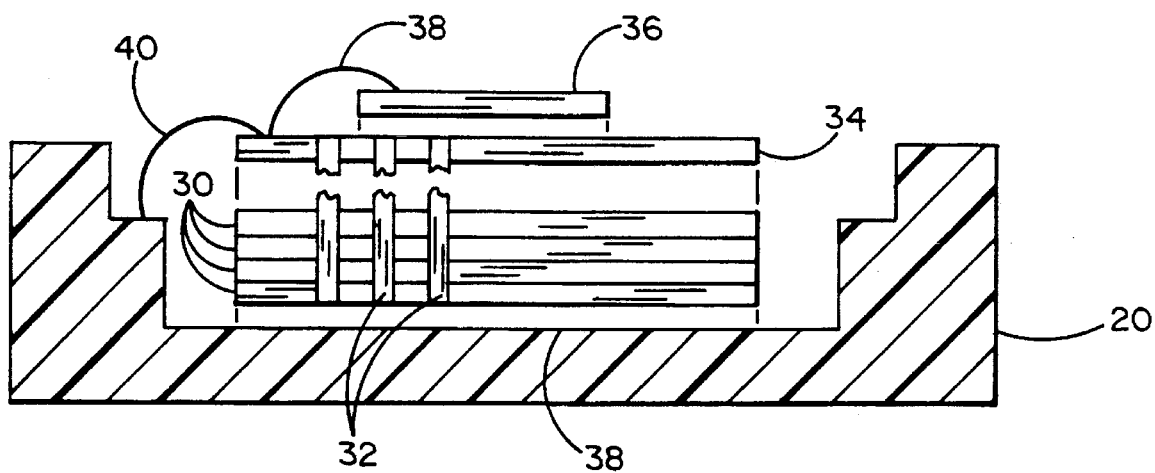
FIGS. 2, 3 and 4 are exploded elevation views of three different versions of "pancake" stacks of chips, as they would be combined and supported in the lower portion of a plastic or ceramic enclosure.
Figure 3:
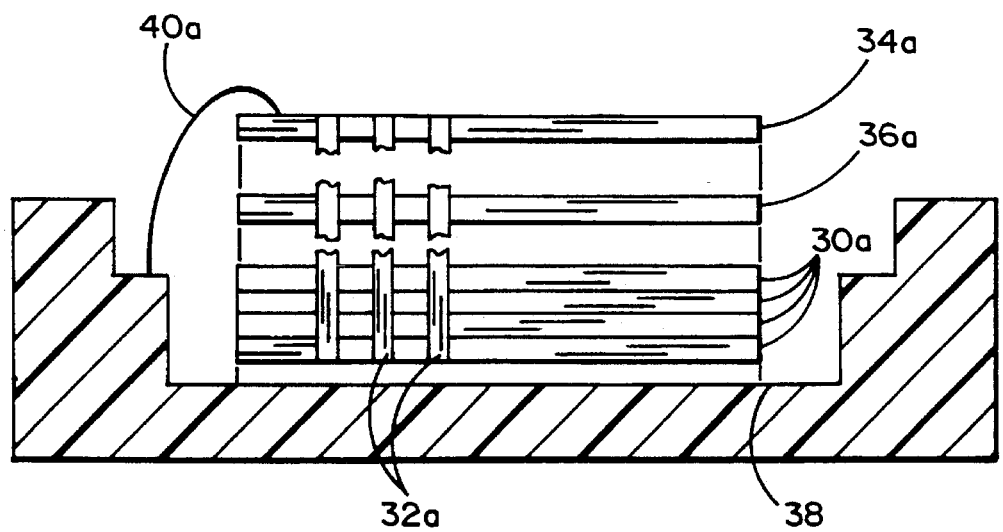
Figure 4:
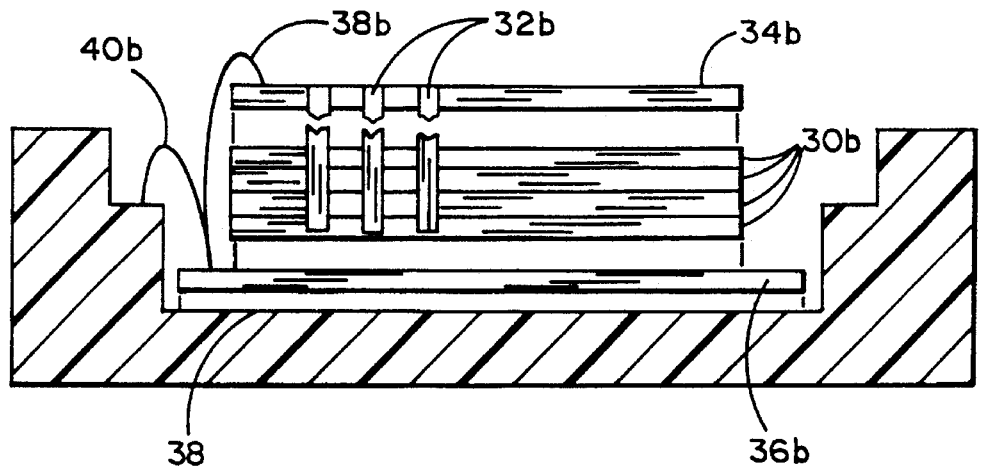

FIGS. 2, 3 and 4 show three different chip-stacking concepts in which "pancake" stacks are used, i.e., stacks in which the layers are parallel to the supporting plane under the stack. In FIG. 2, four silicon IC chips 30 are active chips containing IC memory capacity. Each of the chips 30 has a large number of parallel leads which are originally exposed at the access plane of the stack, i.e., the stack surface seen in the figure. Bus strips 32 and other terminals are applied to the access plane, in order to provide electrical connections to exterior circuitry.

Above the four silicon IC chips 30 is a ceramic cap layer 34. The cap layer 34 is the terminal-carrying layer in Ser. No. 08/232,739. In FIG. 2, the cap layer is next to the four memory chips 30. The extra (6th) layer, which is needed to "translate" signals moving between the memory stack and the host system, is shown in FIG. 2 as a smaller IC chip 36 mounted on top of ceramic layer 34. All six of the chips are glued together and are glued to the surface 38 provided by the lower portion 20 of the enclosure (see FIG. 1). As stated above, the acronym "VIC" has been applied to the added IC chip, the letter V representing "virtual", to reflect its function in converting the stack of memory chips into the equivalent of a single memory chip.

As in Ser. No. 08/232,739, the ceramic layer 34 has conducting traces on its lower surface which lead from T-connects on the access plane to interior locations where vias have been formed extending through the ceramic layer. Metallic conductors extend through the vias to connect with terminals formed on the upper surface of the ceramic layer 34. As shown in FIG. 2, wire bonds 38 may be used to connect terminals on the VIC chip 36 to certain terminals on the ceramic layer 34. And other wire bonds 40 may be used to connect other terminals on the ceramic layer 34 to leads extending outside the sealed package (e.g., the J-shaped leads in FIG. 1).

In FIG. 3, a VIC chip 36a is located between four memory chips 30a and a ceramic cap layer 34a. The six layers are glued together and are supported on surface 38. Wire bonds 40a may be used to connect to leads extending outside the sealed package. Internal connections are used between the VIC chip 36a and the memory chips 30a.

In FIG. 4, the VIC chip is in the form of an "active substrate" 36b, which both supports the chips 30b in the memory stack and contains integrated circuitry which provides interface connection between the memory stack and the host system. A ceramic layer 34b is at the top of the stack. Its terminals may be connected by wire bonds 38b to terminals on the active substrate 36b. And wire bonds 40b connect other terminals on substrate 36b to leads extending outside the sealed package.

In all structures which substitute multiple memory chips for a single memory chip, the VIC chip must be electronically interposed between the memory stack and the host system, for the purposes previously mentioned. The control (decoding) functions must be altered; and the means for driving and buffering the incoming and outgoing signals must be altered.

In FIGS. 2, 3 and 4, the number of memory chips shown is four. This number may be increased, if adequate vertical space (headroom) is available.

Figure 5:
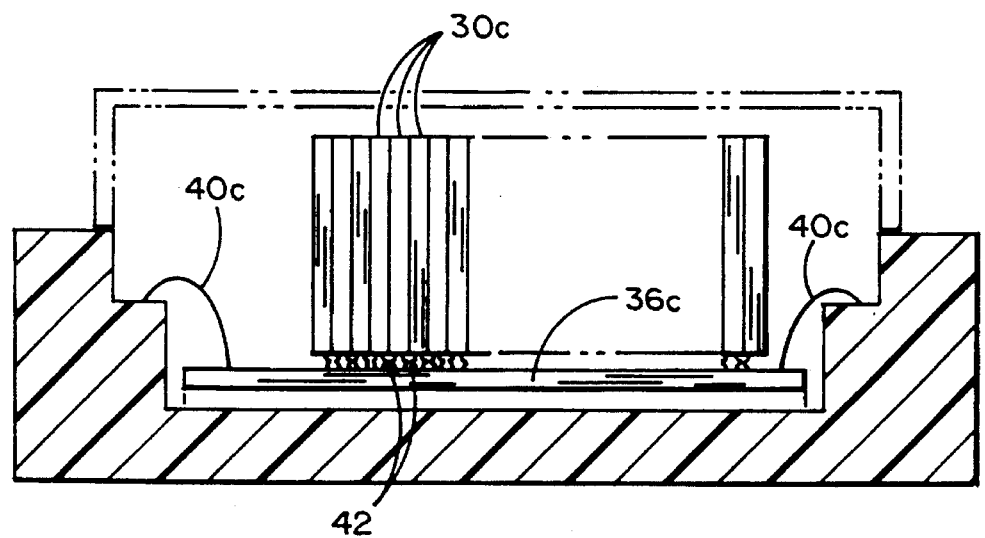
FIG. 5 is an elevation view of a "sliced bread" stack of chips supported by and bonded to an active substrate, which engages the supporting surface of the package enclosure.

FIG. 5 shows a somewhat more radical concept. The stack of memory chips is of the type referred to as a "sliced bread" stack. It permits a much larger number of memory chips to be included in the stack. Since the vertical dimension is greater than that of a "pancake" stack, the package cover would probably need to be shaped differently from the cover shown in FIG. 1. The memory chips 30c in FIG. 5 are supported on an active substrate 36c, to which they are bonded by flip chip bonds 42. No ceramic layer is included. Wire bonds 40c may connect terminals on the active substrate to leads extending outside the sealed package. The flip chip bonds 42 carry signals between the active substrate 36c and the memory chips 30c.

Common assignee application Ser. No. 08/255,465 describes in detail the use of an active substrate as a carrier of integrated circuitry capable of providing numerous valuable interface functions between a memory stack and exterior circuitry.

In order to obtain the full benefits of the present invention, the VIC chip (i.e., the chip providing the necessary electronic interface with the host system) is dedicated to and structurally integrated with its stack.. It is also located in substantially the same area as the stack, showing essentially the same footprint, in order to operate most efficiently and in order to conserve horizontal area in the host system.

Figure 6:
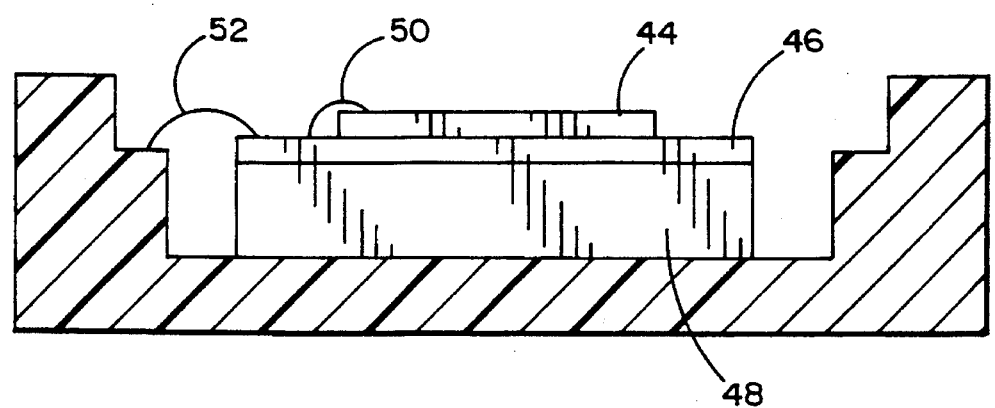
FIG. 6 shows the IC chips of FIG. 2 mounted in the lower portion of a JEDEC package.

The next step in this description is to detail the circuitry on a VIC chip used in a specific package. The package described in the greatest detail is one which converts four 1 Megabit SRAM IC chips into the equivalent of a single 4 Megabit SRAM IC chip. FIG. 6, which is similar to FIG. 2, shows a VIC chip 44 secured to the top of a ceramic terminal layer 46, which in turn is secured to a stack 48 comprising, in this embodiment, four IC SRAM chips, each having 1 Megabit capacity. Wire bonds 50 are shown connecting terminals on VIC chip 44 to terminals on layer 46; and wire bonds 52 are shown connecting terminals on layer 46 to terminals which lead to external circuitry (i.e., the host system). Most of the electrical connections between the host system and the chip stack 48 pass through the VIC chip 44, because of the need to decode and/or alter the drive capability of the incoming or outgoing signals. However, the power supply to the package, as represented by the symbols Vcc and Vss, is taken directly to the chips in the memory stack.

Figure 7:
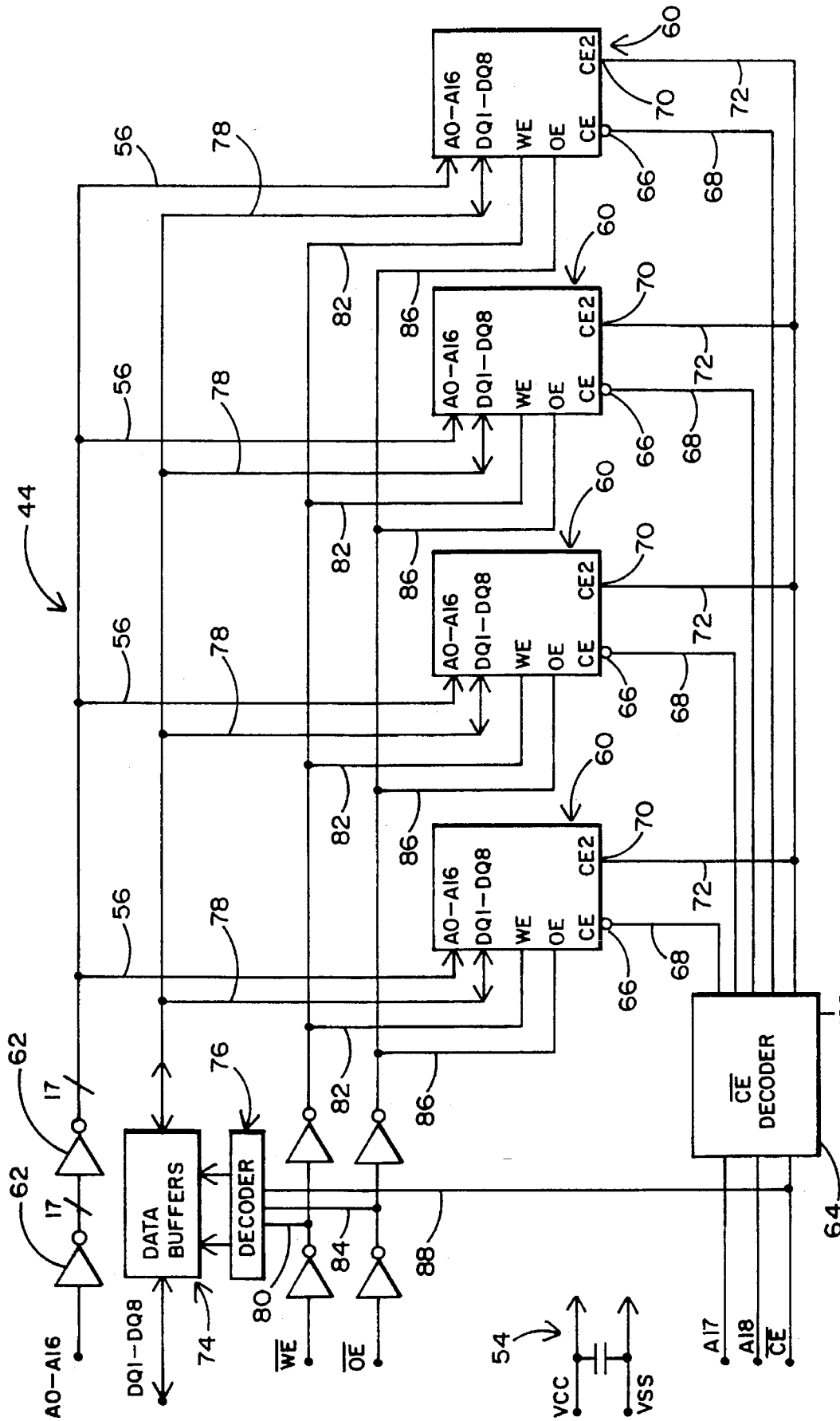
FIG. 7 is a block diagram of the "VIC" chip circuitry and its connections with the four memory chips.

FIG. 7 is a diagram of the circuitry in the stacked chip package, including the four IC memory chips, and the VIC chip 44, which is needed to provide appropriate connections between the host system and the four identical stacked SRAM chips 60. The Vcc/Vss power source 54 is diagrammed at the left side of the figure. As shown at the top of the figure, 17 address lines A0–A16 each connect directly via lines 56 to each of the four memory chips 60. Each memory chip is arranged as a 128K×8 (bit) unit; and $2^{17}=131,072$, which is referred to as 128K in computer parlance. A 128K×8 memory chip is referred to as a 1 Megabit memory. Simple one-way buffers 62 are provided in address lines A0–A16, because address information is flowing only one way, i.e., into the memory. To the input from the host system, the 4-chip unit appears the same as a single chip unit.

The four chip stack provides a 512K×8 bit memory capacity. In order to address this four stack memory, two additional address lines A17 and A18 and a decoder 64 are required (shown at the bottom of the figure). The 512K represents $2^{19}$ (524,288) bits. The 512K×8 memory of the stacked chips is referred to as a 4 Megabit memory. Decoder 64 has three inputs: address lines A17, A18, and enable line $\overline{CE}$. The decoder provides four options, by means of which one of the four chips 60 is enabled, while the other three are not enabled. The four options from the decoder 64 represent (a) both lines high, (b) both lines low, (c) the first line high and the second line low, and (d) the first line low and the second line high. The $\overline{CE}$ port 66 of each chip 60 receives the enable/not enable signal from decoder 64, via one of the lines 68. The CE2 port 70 of each chip 60 is present on the chip, but is not used in the VIC circuitry. Therefore, the ports 70 are grounded by lines 72.

Recapitulating the use of the VIC chip to cause the four chip stack to be addressed as if there were a single higher capacity chip, there are 19 address lines available at the package. A17 and A18 are decoded in the VIC chip to select one of the four chips in the stack. The remaining address lines, A0–A16, feed into all four memory chips. Thus A17 and A18 select the stack layer and A0–A16 select the memory location. From the outside (i.e., the host system) it appears that lines A0–A18 are selecting the memory location just as it would appear if a single 4 Megabit chip were being addressed. The layer is selected by decoding A17 and A18 and using the result to drive the appropriate chip enable.

The other portion of the memory interface problem deals with data transmission, which can flow in both directions, i.e., from the host system into the stacked chip package, or out of the package into the host system. As stated above, the data in this system travels along 8 parallel lines, which are labelled, in FIG. 7, DQ1–DQ8. The data lines in the VIC chip are buffered by "tri-state" buffers. The term "tri-state" refers to three possible conditions: (a) coming in, (b) going out, or (c) off. In FIG. 7, the data buffers are represented by a block 74. Another block 76 represents a decoder, which controls the data flow. Three control lines are connected to the data buffer decoder 76: chip enable line $\overline{CE}$, write enable line WE, and output (read) enable line OE. The data buffers 74 are connected to each of the four chips by lines 78. The write enable signal, in addition to its decoder line 80, is connected directly to each of the chips 60 by lines 82. The output (read) enable signal, in addition to its decoder line 84, is connected directly to each of the chips 60 by lines 86. The chip enable signal is connected to decoder 76 by line 88. The data buffers 74 on the VIC chip cause the 4 chip stack to appear to the host system as a single chip. Instead of driving the input capacitance of four memories in parallel, the host system is only driving the input capacitance of the VIC, which in turn drives the parallel capacitance of the four memory chips.

The data control logic determines the direction of flow of the data. The address lines control the location on each chip to or from which the data travels.

Figure 8:
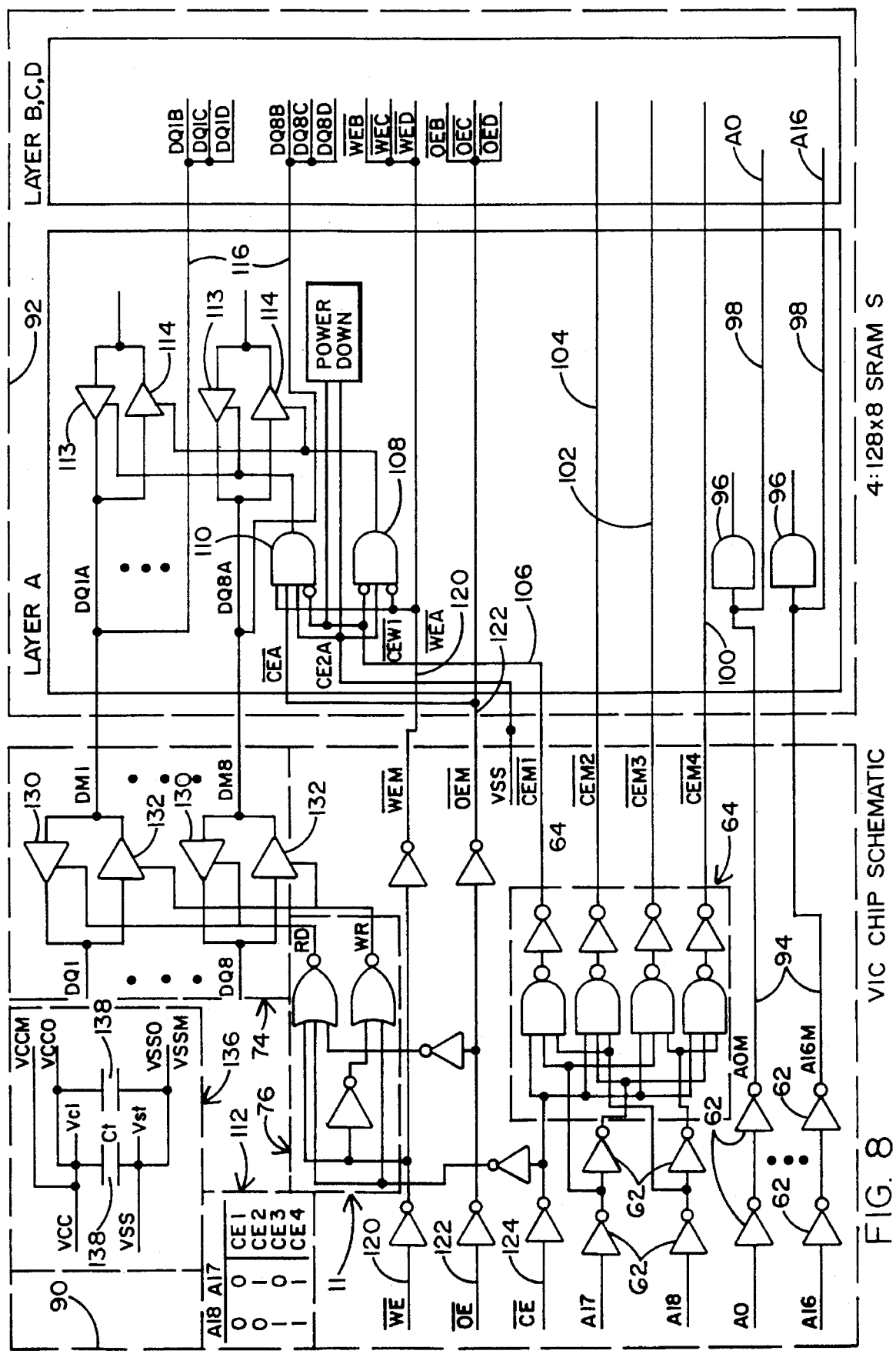
FIG. 8 is a schematic showing details of the circuitry in FIG. 7.

FIG. 8 shows the integrated circuitry of VIC chip 44 in greater detail, and also shows its interconnection to the memory chips. The dashed line rectangle 90 surrounds the integrated circuitry on the VIC chip. The dashed line 92 surrounds the circuitry on the four memory chips. "Layer A" represents one of the four chips, and "Layer B, C, D" represents each of the other three chips. The circuitry of each of the four memory chips is identical.

Beginning at the bottom of FIG. 8, lines 94 are shown connecting each of address lines A0–A16, whose signals have passed through buffers 62, to the memory chip designated Layer A. Blocks 96 on Layer A represent the address circuitry on the chip. Lines 98 are shown connecting each of the address lines A0–A16 to Layers B, C and D, representing each of the other three memory chips.

The next segment of circuitry above the address lines A0–A16 in FIG. 8 is the logic in decoder 64, which uses address lines A17, A18 and $\overline{CE}$ to select which of the four chips is enabled. Buffers 62 are provided on lines A17 and A18 ahead of decoder 64. Line 100, which is also designated $\overline{CEM4}$, leads from the decoder to the fourth memory chip in the stack (Layer D). Line 102, which is also designated $\overline{CEM3}$, leads from the decoder to the third memory chip in the stack (Layer C). Line 104, which is also designated $\overline{CEM2}$, leads from the decoder to the second memory chip in the stack (Layer B). Line 106, which is also designated $\overline{CEM1}$, leads from the decoder to the gates 108 and 110, which are part of the control system on the first memory chip in the stack (Layer A). The same circuitry is present on each of the four memory chips. The chart enclosed by dashed line 112 shows the logic that determines which of the four chips is enabled.

As seen in FIG. 8, each memory chip 60 (Layers A, B, C and D) incorporates data buffering circuitry in the data read and write lines DQ1A,B,C&D–DQ8A,B,C&D. Each data line has an output (read) amplifier/buffer 113, and an input (write) amplifier/buffer 114. In other words, the on-chip data buffers are tri-state buffers. This buffering circuitry is, in effect, redundant with the special buffering and driving circuitry on the VIC chip, described below. Lines 116 symbolize the presence of on-chip buffering on each of Layers B, C and D.

Data buffers 74 and data lines DQ1–DQ8 are shown at the top of the VIC schematic in FIG. 8. They are under control of logic circuitry included in decoder 76 of FIG. 7, which responds to the interactions of three input lines: (1) $\overline{WE}$ line 120, which is a "write" enable signal (i.e., bringing data into the memory); (2) $\overline{OE}$ line 122, which is a "read" enable signal (i.e., outputting data from the memory); and (3) $\overline{CE}$ line 124, which is the same chip enable signal used in selecting the appropriate chip in the address portion of the control logic. In addition to controlling the logic which enables the buffers on the VIC chip, the $\overline{WE}$ and $\overline{OE}$ lines 120 and 122 lead to each of the four memory chips to enable the buffers 113 and 114 on each chip.

Each of the data lines DQ1–DQ8 on the VIC chip has a tri-state buffer/amplifier. Each output (read) buffer/amplifier 130, which is generally referred to as a driver, is relatively powerful, because it is sending signals off the memory chips toward the computer in the host system.

The function of each tri-state buffer on the VIC chip is to translate signals designed for use by a monolithic chip (one large memory chip) into signals involving a stack of four memory chips, without disturbing the host system. In other words, the VIC chip causes the four-chip stack to mimic a single chip having the same memory capacity by making four loads appear to be a single load. The capacitance of four gates in parallel should appear to be the capacitance of a single gate.

A significant feature of the circuitry on the VIC chip is its power supply capacitance, shown in the dashed line rectangle 136. A high capacitance is desired, in order to transfer signals quickly, both incoming and outgoing. One large capacitor, or a plurality of capacitors 138, may be used. The large capacitance on the VIC chip can cause the necessary current flow as voltages change. By stabilizing the voltage levels, noise is reduced, and transitions between high and low occur faster. The need to provide signal transfer is important for both outgoing and incoming signals. One of the reasons for the high capacitance on the VIC chip is the fact that each of the four memory chips in the stack was designed to function as a single chip. Some advantages could be obtained by custom designing stacked chips with the intention of substituting the package for a single memory chip.

The foregoing explanation re a SRAM package substituting stacked memory chips for a single memory chip is also generally applicable to EEPROM and FLASH memories. In addition to 4 chip stacks, larger stacks are feasible, e.g., 8 or 16 chip stacks.

The following description focuses on using the present invention in conjunction with DRAM memories. The basic concepts are the same, but the difference of DRAMS from SRAMs dictates a somewhat different electronic configuration for the VIC, in order to cause the stack of DRAM chips to mimic a single larger capacity DRAM chip. Two general types of configurations are available by which the present invention can replace a single chip with a plurality of stacked chips. In one type, the VIC chip has no address decoding; in the other type, the VIC chip has address decoding but not data decoding.

Figure 9:
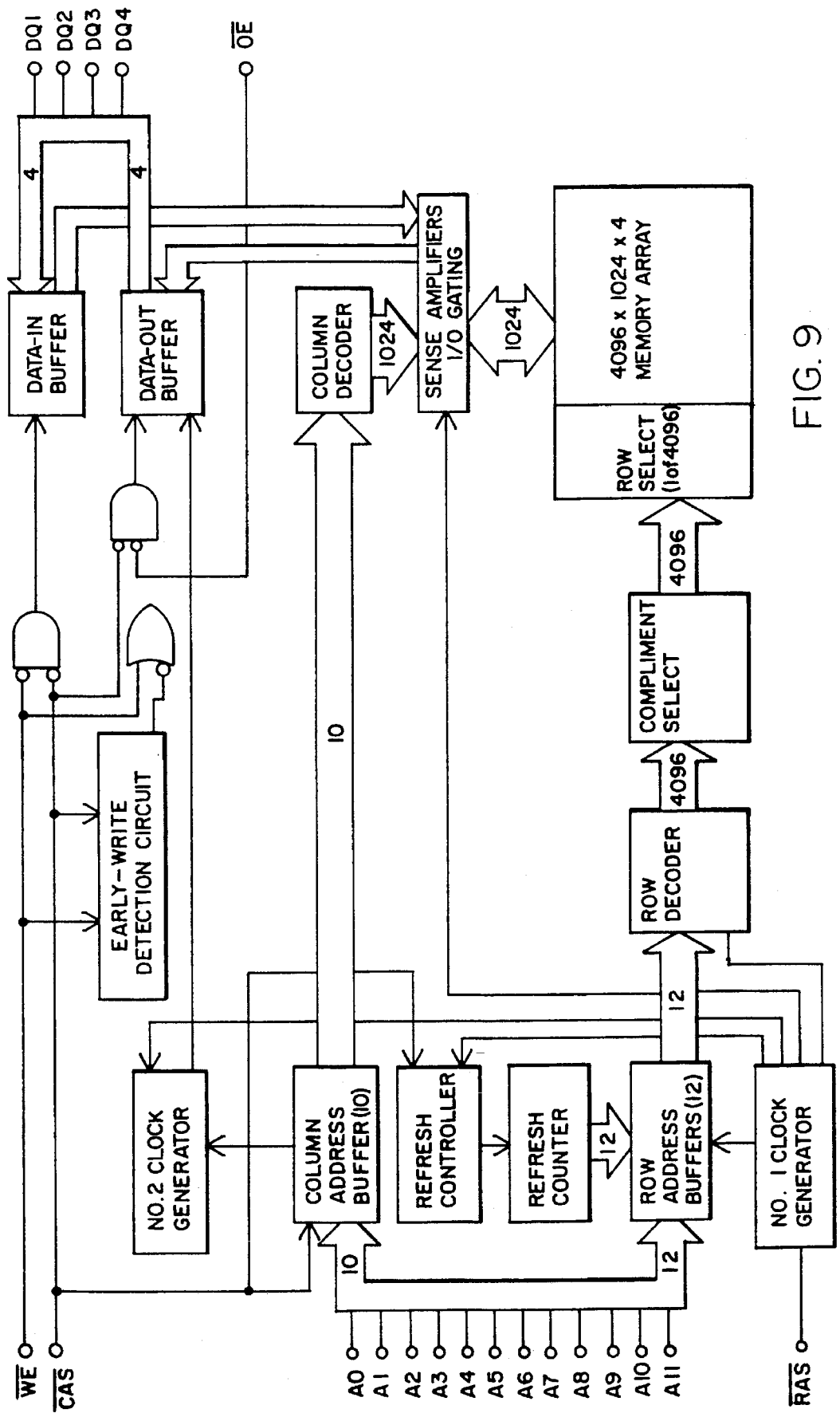
FIG. 9 shows a diagram of a commercially available 16 MEG single chip DRAM.

FIG. 9 shows the functional block diagram of a state of the art 16 MEG DRAM chip designed by Micron Semiconductor, Inc. By packaging four 16 MEG DRAM chips, e.g., four of the Micron chips shown in FIG. 9, the present invention will provide a 64 MEG DRAM package, which will fit into a host system and perform as if it were a single 64 MEG DRAM chip.

The memory array of the chip in FIG. 9 is arranged as 4096×1024×4, which provides a 16 MEG (16, 777,216 bits) chip. Data lines DQ1–DQ4 are connected to a data-in buffer and a data-out buffer. Twelve address lines A0–A11 are fed to 12 row address buffers and to 10 column address buffers. In the column address, A10–A11 are "don't care" bits. The column address buffers are bused to a column decoder which selects 1 of the 1024 columns. The row address buffers are bused to a row decoder, which selects 1 of the 4096 rows. Read and write cycles are selected with the +e,fra WE+ee input. The four data inputs and the four data outputs are routed through four pins using common I/O, and pin direction is controlled by +e,fra WE+ee and +e,fra OE+ee .

Figure 10:
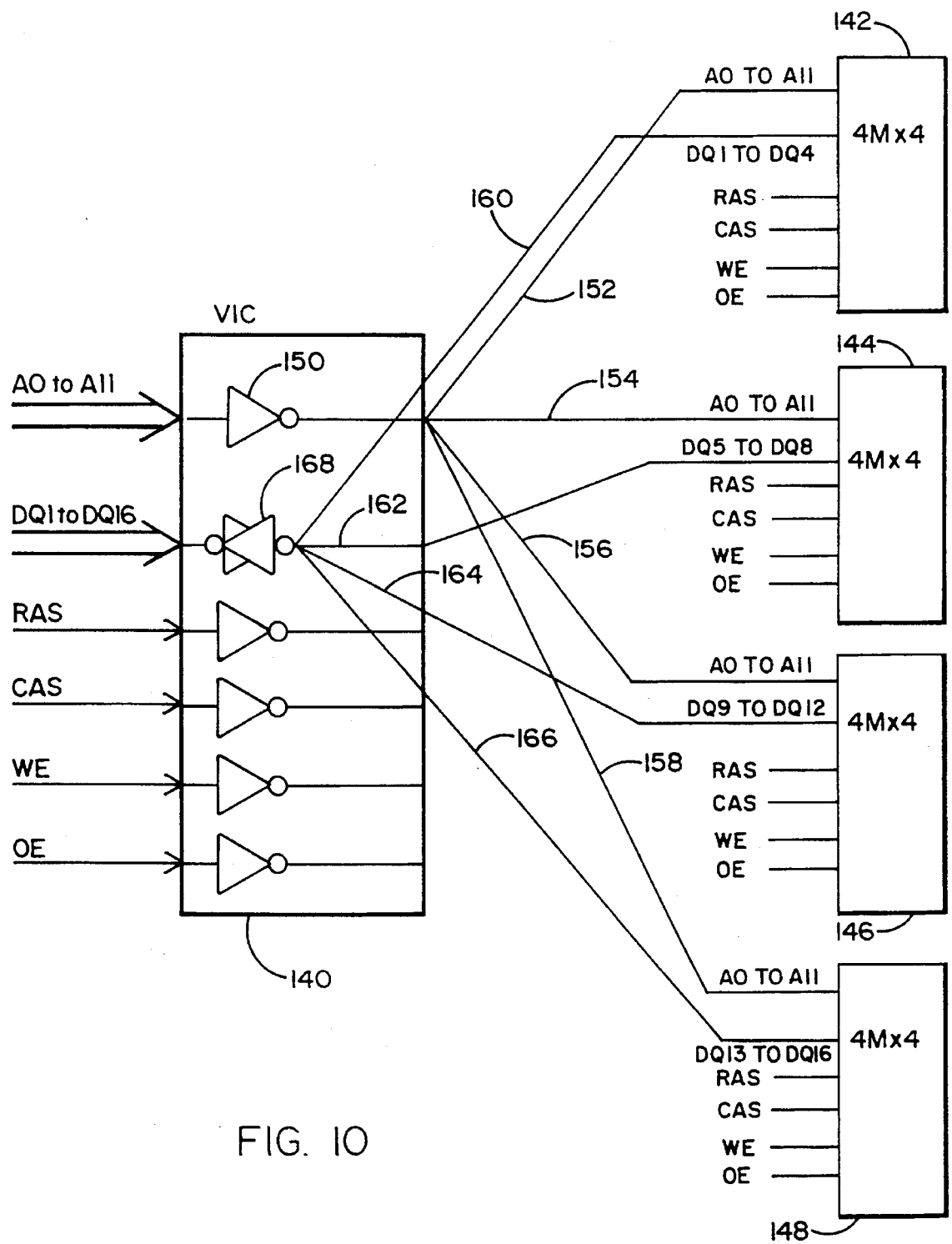
FIG. 10 shows a diagram of a 64 MEG DRAM package having a VIC which does not include an address decoder.
Figure 11:
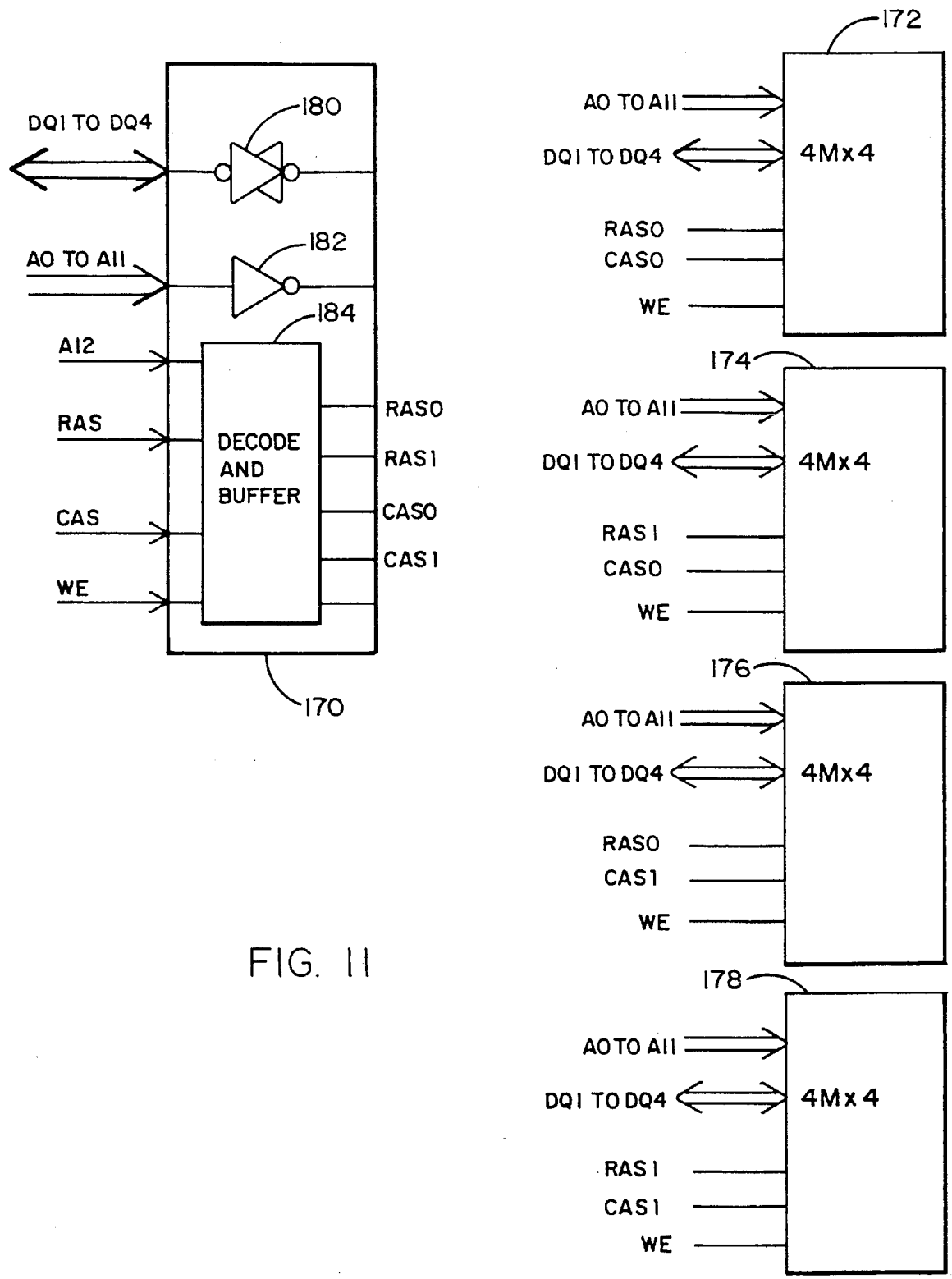
FIG. 11 shows a diagram of a 64 MEG DRAM package having a VIC which does include an address decoder.

FIGS. 10 and 11 each show a 64 MEG DRAM package in which four 16 MEG chips are stacked. Such chips might be the same as the chip diagrammed in FIG. 9, or they might be other types of 16 MEG chips. FIG. 10 shows a configuration in which the VIC chip provides only buffering and no decoding of the address. FIG. 11 shows a configuration in which the VIC chip provides address decoding.

FIG. 10 shows a diagram of a 64 MEG DRAM package having a VIC chip 140 and four stacked 16 MEG DRAM chips 142, 144, 146 and 148, each 4 MEG×4. The VIC chip 140 feeds the address lines A0–A11 to each of the four IC chips in the stack, after buffering at 150. Line 152 feeds the 12 address lines to chip 142, line 154 feeds the 12 address lines to chip 144, line 156 feeds the 12 address lines to chip 146, and line 158 feeds the 12 address lines to chip 148. When an address comes in from the host system, it is decoded by each of the four IC chips in the stack in parallel. Each IC chip in the stack first decodes the row, using all 12 address bits ($2^{12}$=4096). Then 10 bits of the address are used to decode the column ($2^{10}$=1024). The memory array in each IC chip in the stack is arranged as 4096×1024×4. Each IC chip in the stack receives the same address. However, each IC chip only has a data width of 4 bits.

In this configuration, VIC chip 140 and the stack of four chips can handle data widths of 16 bits. When the host system supplies a 16-bit wide data word, DQ1–DQ16, the first 4 bits DQ1–DQ4 are sent to chip 142 via line 160, the next 4 bits DQ5–DQ8 are sent to chip 144 via line 162, the next four bits DQ9–DQ12 are sent to chip 146 via line 164, and the last four bits DQ13–DQ16 are sent to chip 148 via line 166. All four ICs in the stack are operating in parallel. Thus, decoding of 16 bit wide data takes place by routing the input of VIC buffers 168 to the appropriate IC chip in the stack. Address decoding takes place in each of the stacked IC chips. Decoding is not required to determine which IC chip 142, 144, 146 or 148 is enabled. The RAS (row address strobe), CAS (column address strobe), $\overline{WE}$ (write enable) and OE (output enable) lines are each sent in parallel to each of the four chips in the stack. In sum, the package diagrammed in FIG. 10 is a 64 MEG DRAM organized as a 4 MEG×16 package from 4 layers of 4 MEG×4 monolithic IC chips.

FIG. 11 shows a diagram of a 64 MEG DRAM organized as a 16 MEG×4 package from 4 layers of 4 MEG×4 monolithic IC chips. In this configuration decoding is required in the VIC. The figure has a VIC chip 170 and four stacked 16 MEG DRAM IC chips 172, 174, 176 and 178, each 4 MEG×4. In this configuration, the VIC chip provides address decoding. Data lines DQ1–DQ4, after passing through tri-state buffers 180, are connected to each of the four IC chips. Address lines A0–A11 also are connected to each of the four IC chips, after passing through buffers 182. As in FIG. 10, this provides 12 address lines at each chip.

Decode and buffer circuitry 184 is provided in the VIC chip, because the 12 address lines only address 4096 rows× 1024 columns. Each of these amounts needs to be doubled to obtain a 64 MEG DRAM capacity in the package. The configuration in FIG. 11 may be thought of as 8192×2048 (16 MEG) with a data width of 4 bits. The VIC chip 170 contains an extra address line A12. This line is decoded on the VIC chip, utilizing the RAS and CAS inputs, just as the individual IC memory chips decode the address to provide the necessary address width. The VIC chip in essence decodes to determine which of the 4 IC chips in the stack will be enabled, utilizing the A12 line and the RAS and CAS lines. In this configuration only one IC chip at a time is enabled. Chip 172 is shown enabled by VIC chip outputs RAS-0 and CAS-0; chip 174 is shown enabled by VIC chip outputs RAS-1 and CAS-0; chip 176 is shown enabled by VIC chip outputs RAS-0 and CAS-1; and chip 178 is shown enabled by VIC chip outputs RAS-1 and CAS-1.

Packaging of the stacked chips in the Dram memories of FIGS. 10 and 11 is comparable to that of the SRAM chips detailed earlier. The stacked chips are arranged to fit in a standard package enclosure designated for a single 64 MEG chip.

The host system may or may not have been designed to use a higher capability single chip memory, which is "replaced", in effect, by a stack of chips In many cases, a stack of chips will be used as an upgrading retrofit in a host system previously served by a lower capability memory.

The VIC chip in most cases will have real estate in addition to that required for buffering, decoding, and capacitance. This allows electronic system enhancement, by adding preferred electronic functions to the VIC chip. One such added function of IC circuitry may be error detection and correction. Another added IC function on the VIC chip may be memory cache. Where DRAM chips are used, a necessary function is refreshment for memory retention. A valuable added function might be synchronized memory signals to enhance the speed of the memory function.

As mentioned in the Statement of the Invention, the use of a stack having several same function IC chips, plus a VIC interface chip is not limited to memory modules. Various other uses are feasible, such as a module containing FPGA (field programmable gate array) chips. Such a module is shown in the block diagram of FIG. 12.

Figure 12:
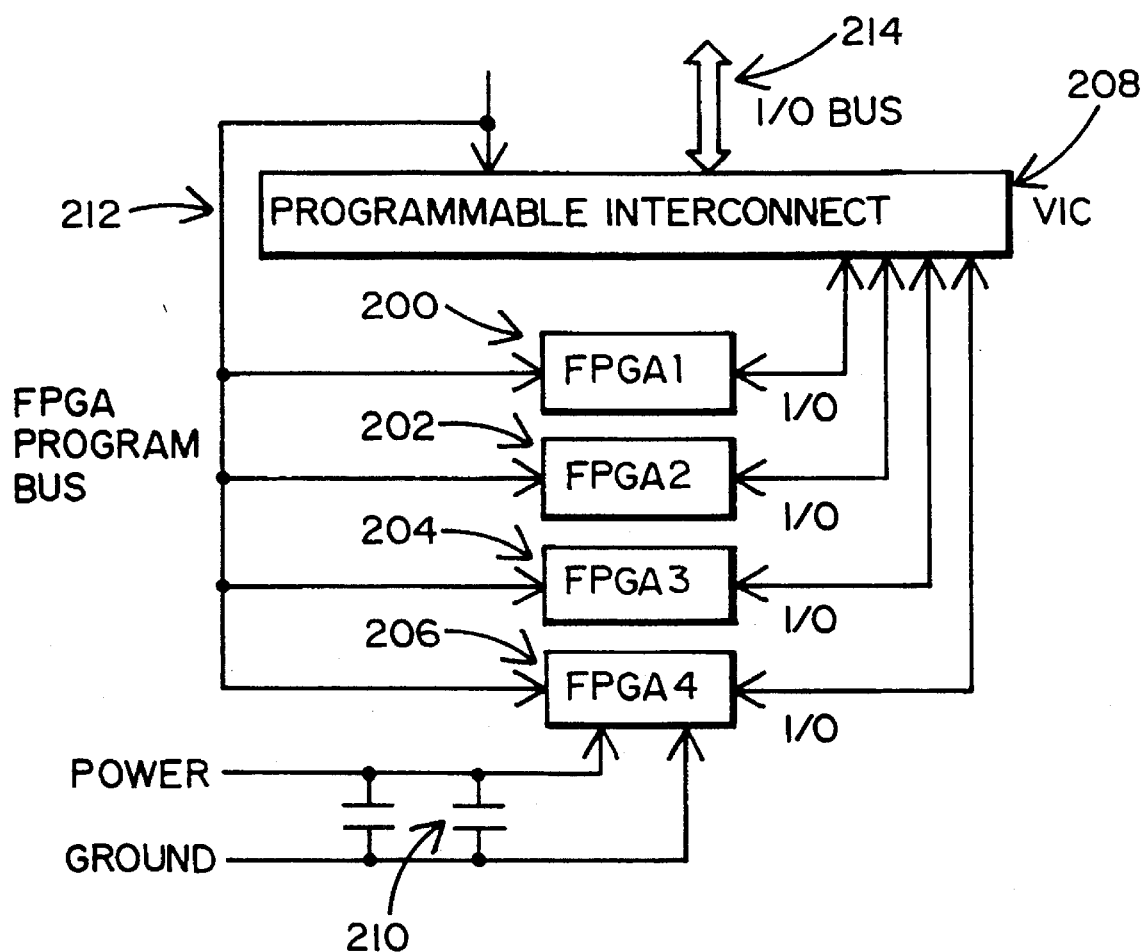
FIG. 12 shows diagrammatically the use of stacked FPGA chips.

The physical layout of the FIG. 12 model may correspond to the structure shown in FIG. 6. Four IC chips 200, 202, 204, and 206 are secured together in a stack. A VIC chip 208 is added to the stack; it is referred to as the "programmable interconnect".

The four IC chips have circuitry providing an array of unconnected gates and transistors. The chips in FIG. 12 are designated FPGA1, FPGA2, FPGA3 and FPGA4. Their IC circuitry is the most extensive of the three types of programmable logic devices. Prior to this invention, designs requiring more than one FPGA have spread the FPGAs on a 2 dimensional printed circuit board, and then added circuitry, so that the overall task to be solved by the FPGAs is divided up in series or parallel among the ICs. The present invention substitutes a stack of FPGA chips having an integral control chip 208.

The IC circuitry in IC chip 208 includes the following functions: (a) input-output buffering to present a unit load instead of a 4 times load on external circuitry; (b) input-output control so that the stack looks like one large content IC (4 times the gates) instead of 4 ICs in a stack; and (c) power supply buffering for increased speed among other "glue logic". The VIC chip also contains the functions of a chip manufactured by Aptix called a "field programmable interconnect" IC. The VIC would replace the Aptix IC that is used in printed circuit board layouts.

The bypass capacitors 210 shown in FIG. 12 are included in the IC circuitry of VIC chip 208. The FPGA program bus 212 has leads into VIC chip 208, and into each of the FPGA chips 200, 202, 204 and 206. Each of the four FPGA chips has a two-way I/O connection with VIC chip 208; and chip 208 is connected to I/O bus 214. As its name implies, the FPGA program bus is used to input signals to the FPGA module, for the purpose of programming the interconnections among the array of gates and transistors in the FPGA chips.

Programming and reprogramming of chips in an FPGA module has extensive potential uses. For example, one module could be programmed to be the microprocessor to run an automatic sprinkler system, or the same device could be reprogrammed to work in a telephone switching system. Such devices are coming into increasing use because complex digital control can be programmed into hardware ICs.

From the foregoing description, it will be apparent that the devices disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. For use in an electronic host system, a stand-alone multiple IC chip module included in the host system in lieu of a single IC chip, said comprising:

a plurality of IC chips secured in planar engagement with one another to form an integrated stack in which all the chips share a footprint area;

said stack including a plurality of same function chips each having integrated circuitry which performs the same electronic function, so that the stack provides a multiplied availability of said function, each of said same function, chips being capable of functioning as a complete unit;

said stack further including an IC interface chip having integrated circuitry which provides transmission and conversion of electronic signals between the electronic host system and all of the same function IC chips in the stack;

the integrated circuitry in the interface chip including circuitry which signal buffering between the circuitry in the stack and the circuitry in the host system, in causes the host electronic system to see the plurality of same function IC chips as though they constituted a single functional unit.

2. The stand-alone module of claim 1, in which the integrated circuitry in the interface chip also includes circuitry which provides power supply buffering between the circuitry in the module and the circuitry in the host system, in order to increase the speed of interaction between the module and the host system.

3. The stand-alone module of claim 1, in which the module provided by the stacked IC chips fits into space available in a pre-designed host system.

4. The stand-alone module of claim 1, in which the integrated circuitry in the same function chips provides dense memory storage.

5. The stand-alone module of claim 1, in which the integrated circuitry in the same function chips provides programmable arrays of logic devices.

6. The stand-alone module of claim 2, in which the integrated circuitry in the same function chips provides programmable arrays of logic devices.

7. The stand-alone module of claim 1, in which the integrated circuitry of the interface chip includes additional circuitry which enhances the performance of the electronic host system.

8. The stand-alone module of claim 1, in which the interface chip is located on top of the stack and has an area smaller than the other chips in the stack.

9. A stand-alone memory package adapted to be used in lieu of a single IC memory chip in space available in a host computer system, comprising:

a plurality of stacked, aligned IC memory chips; and an additional interface IC chip which is dedicated to and structurally combined with the stack in substantially the same footprint, and which is electronically interposed between the stacked chips and the host system in such a way that the latter sees the plurality of IC memory chips as if they were a single IC memory chip.

10. The stand-alone memory module of claim 9 in which each of the stacked IC memory chips has been configured as a chip capable of functioning independently where a lower capacity memory is desired.

11. For use in a host computer system which provides multiple separate address signals and multiple separate data signals, a stand-alone memory package adapted to be used in lieu of and in substantially the same space as a single memory chip, comprising:

a plurality of stacked, glued together IC memory chips;

circuitry in the package which receives incoming address signals from the host system, buffers each of the address signals, and selects the appropriate address on one of the memory chips; and circuitry in the package which receives both incoming and outgoing data signals, buffers each of the separate data signals in both directions, and interconnects the separate data signals between the host system and the stacked memory chips in both directions said circuitry including means for causing the stacked IC chips to mimic, in the host computer system, the electronic characteristics of a single memory chip.

12. The memory package of claim 11 which also includes:

decoding circuitry which causes only one of the chips in the stack to be enabled at a time.

13. The memory package of claim 12 in which the decoding circuitry is controlled by one or more of the incoming address signals.

14. The memory package of claim 11 in which each of the memory chips connects to a different group of data signals in order to provide a data bit word having the width provided by all memory chips in the stack.

15. For use in a host computer system, a stand-alone memory module included in the host computer system in lieu of a single IC memory chip, said module comprising:

a plurality of separate memory traits, each capable of functioning as a complete memory unit, and each incorporated in a single IC memory chip;

the IC chips which incorporate the plurality of separate memory units being secured in planar engagement with one another to form an integrated stack in which all the chips share a footprint area;

said stack further including an IC interface chip having integrated circuitry which provides transmission and conversion of electronic signals between the host computer system and all of the IC chip memory units in the stack;

the integrated circuitry in the interface chip including circuitry which causes the host computer system to see the plurality of IC chip memory units as though they constituted a single memory unit.

16. The memory module of claim 15 in which the integrated circuitry in the interface chip contains address decoding logic which causes signals from the host computer system which are intended to address a single memory unit to address instead the plurality of separate memory units included in the integrated stack.

17. The memory module of claim 15 in which the integrated circuitry in the interface chip contains load converting circuitry which causes a signal from the host computer system representing a single load to be converted into a signal representing a separate load at each of the separate memory units.

18. The memory module of claim 15 in which the integrated circuitry in the interface chip contains capacitance circuitry which is connected to a power source and which causes high speed signal transfer between the host system and the plurality of memory units in the module.

19. The memory module of claim 15 in which the integrated circuitry in the interface chip contains buffering circuitry which buffers signals traveling in either direction between the memory module and the host computer system.

20. The memory module of claim 16 in which the integrated circuitry in the interface chip contains load converting circuitry which causes a signal from the host computer system representing a single load to be converted into a signal representing a separate load at each of the separate memory units.

21. The memory module of claim 16 in which the integrated circuitry in the interface chip contains capacitance circuitry which is connected to a power source and which causes high speed signal transfer between the host system and the plurality of memory units in the module.

22. The memory module of claim 17 in which the integrated circuitry in the interface chip contains capacitance circuitry which is connected to a power source and which causes high speed signal transfer between the host system and the plurality of memory units in the module.

23. The memory module of claim 20 in which the integrated circuitry in the interface chip contains capacitance circuitry which is connected to a power source and which causes high speed signal transfer between the host system and the plurality of memory units in the module.

* * * * *

UNITED STATES PATENT AND TRADEMARK OFFICE
CERTIFICATE OF CORRECTION

PATENT NO. : 5,581,498
DATED : December 3, 1996
INVENTOR(S) : Ludwig et al.

It is certified that error appears in the above-identified patent and that said Letters Patent is hereby corrected as shown below:

Column 8, line 52: Delete "+e,fra WE+ee", and insert -- $\overline{WE}$ --.

Column 8, line 55: Delete "+e,fra WE+ee and +e,fra OE+ee", and insert -- $\overline{WE}$ and $\overline{OE}$ --.

Column 8, last line: Change "all" to -- A11 --.

Column 9, line 26: Change "$\overline{WE}$", to -- WE --.

Column 11, line 8 (Claim 1): After "said", insert -- module --.

Column 11, lines 24-25 (Claim 1): Delete "signal buffering between the circuitry in the stack and the circuitry in the host system, in".

Column 12, line 32 (Claim 11): Change "traits" to -- units --.

Signed and Sealed this

Twenty-second Day of April, 1997

*Attest:*

BRUCE LEHMAN

*Commissioner of Patents and Trademarks*

*Attesting Officer*